(12) United States Patent
Kim

(10) Patent No.: US 8,431,944 B2
(45) Date of Patent: Apr. 30, 2013

(54) LIGHT EMITTING DEVICE, LIGHT EMITTING DEVICE PACKAGE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 67 days.

(21) Appl. No.: 13/087,487

(22) Filed: Apr. 15, 2011

(65) Prior Publication Data

US 2011/0211354 A1 Sep. 1, 2011

(30) Foreign Application Priority Data

Apr. 23, 2010 (KR) .................. 10-2010-0037876

(51) Int. Cl.
*H01L 33/60* (2010.01)
*F21V 3/00* (2006.01)

(52) U.S. Cl.
USPC .............. 257/98; 257/E33.072; 257/E33.073; 362/311.01

(58) Field of Classification Search .................. None
See application file for complete search history.

(56) References Cited

U.S. PATENT DOCUMENTS

| | | | | |
|---|---|---|---|---|
| 6,420,732 B1 * | 7/2002 | Kung et al. | ..................... | 257/79 |
| 7,687,294 B2 * | 3/2010 | Kim et al. | ..................... | 438/46 |
| 2005/0285132 A1 * | 12/2005 | Orita | ..................... | 257/99 |
| 2009/0026468 A1 | 1/2009 | Sakai et al. | ..................... | 257/88 |
| 2009/0267092 A1 | 10/2009 | Fukshima et al. | ............. | 257/98 |
| 2010/0072487 A1 * | 3/2010 | Tsai et al. | ..................... | 257/86 |
| 2010/0093123 A1 * | 4/2010 | Cho et al. | ..................... | 438/42 |

FOREIGN PATENT DOCUMENTS

| | | |
|---|---|---|
| JP | 2005-142602 A | 6/2005 |
| KR | 10-2006-0038756 A | 5/2006 |
| KR | 10-2009-0071088 A | 7/2009 |

OTHER PUBLICATIONS

Steigerwald, D.A., et. al. IEEE Journal on Selected Topics in Quantum Electronics, vol. 8, No. 2, Mar./Apr. 2002 p. 310.*
Cho, Hyun Kyong, Sun-Kyung Kim, Duk Kyu Bae, Bong-Cheol Kang, Jeong Soo Lee, and Yong-Hee Lee. "Laser Liftoff GaN Thin-Film Photonic Crystal GaN-Based Light-Emitting Diodes." IEEE Photonics Technology Letters 20.24 (2008):2096-098.*
Trieu, S, et. al. "Light Extraction Improvement of GaN-based Light Emitting Diodes using Patterned Undpoed GaN Bottom Reflection Gratings" Proc. of SPIE vol. 7216 72162Q-1.*
Xi, J.-Q., Hong Luo, Alyssa J. Pasquale, Jong Kyu Kim, and E. Fred Schubert. "Enhanced Light Extraction in GaInN Light-Emitting Diode With Pyramid Reflector." IEEE Photonics Technology Letters 18.22(2006):2347-349.*

(Continued)

*Primary Examiner* — Thomas L Dickey
*Assistant Examiner* — Joseph Schoenholtz
(74) *Attorney, Agent, or Firm* — KED Associates LLP

(57) ABSTRACT

Disclosed are a light emitting device, a light emitting device package, and a lighting system. The light emitting device includes an electrode layer, a current density adjusting pattern on the electrode layer, and a light emitting structure on the electrode layer and the current density adjusting pattern. A column pattern or a hole pattern serving as a structure of a resonant cavity is formed at an upper portion of the light emitting structure.

20 Claims, 19 Drawing Sheets

OTHER PUBLICATIONS

Kim T, Danner A.J., Choquette K.D., Enhancement in external quantum efficiency of blue light-emtttting diode by photonic crystal surfcae grating, Electronics Letters Sep. 29, 2005 vol. 41 No. 20.*

Trieu, Simeon S., and Xiaomin Jin. "Study of Top and Bottom Photonic Gratings on GaN LED With Error Grating Models." IEEE Journal of Quantum Electronics 46.10 (2010): 1456-463.*

Giamello, Notel, "LED Backlighting for LCDs: Options, Design Considerations, and Benefits" Informational Document LCD Products, Sharp Microelectronics of the Americas, Mar. 2010. Retrieved from the internet at URL <http://www.sharpledlcd.com/resources/LED%20Backlight%20Whitepaper.pdf>.*

* cited by examiner

LIGHT EMITTING DEVICE, LIGHT EMITTING DEVICE PACKAGE, AND LIGHTING SYSTEM

The present application claims priority under 35 U.S.C. 119 to Korean Patent Application No. 10-2010-0037876 filed on Apr. 23, 2010, which is hereby incorporated by reference in its entirety.

BACKGROUND

The embodiment relates to a light emitting device, a method of fabricating the same, a light emitting device package, and a lighting system.

Since a nitride semiconductor represents higher thermal stability and wider bandgap energy, the nitride semiconductor attracts great attention in development of an optical device and a high-power electronic device. In particular, blue, green, and UV light emitting devices comprising the nitride semiconductor have been commercialized and extensively used.

The efficiency of the light emitting device is mainly divided into external light emission efficiency and internal light emission efficiency. Among them, the external light emission efficiency refers to the probability of outputting a light from an active layer to the outside of a device, and has a restricted value due to the total reflection caused by the difference in the refractive index between a semiconductor layer and air or a background material such as epoxy.

In order to improve the external light emission efficiency, two concepts may be taken into consideration. First, a scheme of employing the roughness structure or the periodical concave-convex structure for the interface of the semiconductor layer may be taken into consideration. Second, resonant cavity effect may be used likewise a resonant cavity LED.

When the interface of the semiconductor layer is deformed by the roughness structure or the periodical concave-convex structure, the light confined due to the total reflection can be extracted to the outside.

In contrast, when the resonant cavity effect is used, the direction of the light emitted from the active layer is adjusted through an intrinsic mode of the resonant cavity, so that light extraction efficiency can be improved and the directionality of the light can be adjusted.

SUMMARY

The embodiment provides a light emitting device, a method of fabricating the light emitting device, a light emitting device package, and a lighting system.

The embodiment provides a light emitting device capable of improving light extraction efficiency.

The embodiment provides a light emitting device having a light emitting pattern of concentrating a light in a vertical direction.

According to the embodiment, the light emitting device comprises an electrode layer, a current density adjusting pattern on the electrode layer, and a light emitting structure on the electrode layer and the current density adjusting pattern. A column pattern or a hole pattern serving as a structure of a resonant cavity is formed at an upper portion of the light emitting structure.

According to the embodiment, a light emitting device package comprises a body, at least one lead electrode on the body, and a light emitting device electrically connected to the lead electrode. The light emitting device comprises an electrode layer, a current density adjusting pattern on the electrode layer, and a light emitting structure on the electrode layer and the current density adjusting pattern. A column pattern or a hole pattern serving as a structure of a resonant cavity is formed at an upper portion of the light emitting structure.

According to the embodiment, a lighting system comprises a board, and a light emitting module comprising a light emitting device on the board. The light emitting device comprises an electrode layer, a current density adjusting pattern on the electrode layer, and a light emitting structure on the electrode layer and the current density adjusting pattern. A column pattern or a hole pattern serving as a structure of a resonant cavity is formed at an upper portion of the light emitting structure.

According to the light emitting device and a method of fabricating the same of the embodiment, light extraction efficiency can be improved through the effect of the resonant cavity based on the adjustment of the current density.

In addition, the embodiment provides a resonant cavity light emitting device based on the adjustment of current density to improve light extraction efficiency through the cooperation with the vertically-directional vibration mode in the structure of the resonant cavity. Accordingly, a light emission pattern concentrated in the vertical direction can be obtained.

DETAILED DESCRIPTION OF THE EMBODIMENTS

Figure 1:
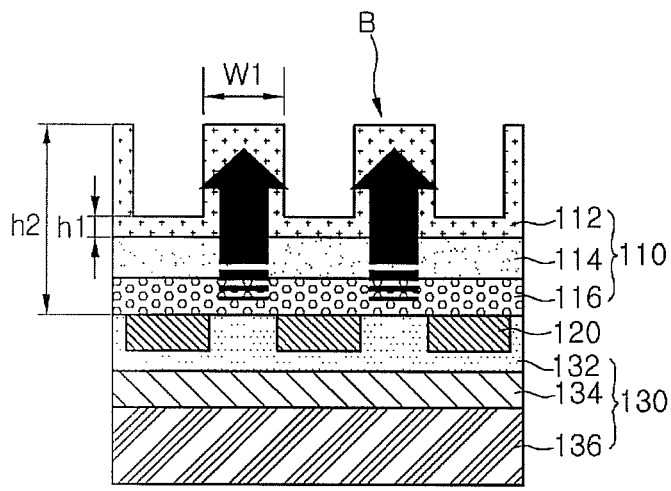
FIGS. 1, 1A, 2 and 2A are side sectional views showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device according to the embodiment, a method of fabricating the light emitting device, and a light emitting device package will be described with reference to accompanying drawings.

Figure 2:
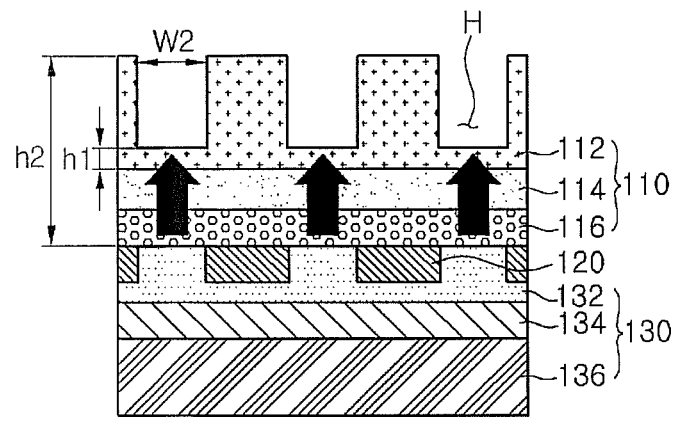

FIGS. 1 and 2 are side sectional views showing the light emitting device according to the embodiment.

The light emitting device according to the embodiment comprises a light emitting structure 110, a current density adjusting pattern 120, and an electrode layer 130. The light emitting structure 110 may comprise the structure of a resonant cavity. The structure of the resonant cavity provided in the light emitting structure 110 will be described in detail below.

The light emitting structure 110 may comprise a first conductive semiconductor layer 112, an active layer 114, and a second conductive semiconductor layer 116. The current density adjusting pattern 120 may be provided below the second conductive semiconductor layer 116. The light emitting structure 110 may comprise the second conductive semiconductor layer 116, the active layer 114 provided on the second conductive semiconductor layer 116, and the first conductive semiconductor layer 112 provided on the active layer 114. The structure of a resonant cavity may be formed at an upper portion of the light emitting structure 110.

The electrode layer 130 may comprise a conductive support member 136, a reflective layer 134, and an ohmic layer 132, and may supply power to the light emitting structure 110. In addition, the reflective layer 134 reflects upward a light incident thereon from the active layer 114, thereby improving the light extraction efficiency of the light emitting device.

FIG. 1 is a sectional view showing the light emitting device according to a first embodiment and shows an example that the structure of the resonant cavity comprises a column pattern B. The first conductive semiconductor layer 112 may have a first thickness to provide the column pattern B and a second thickness formed under the column pattern B. FIG. 2 is a sectional view showing the light emitting device according to a second embodiment and shows an example that the structure of the resonant cavity comprises a hole pattern H. The first conductive semiconductor layer 112 may have a first thickness to provide the hole pattern H and a second thickness formed under the hole pattern H.

The current density adjusting pattern 120 allows carriers (current) to flow in the active layer 114 provided below the column pattern B (see FIG. 1) or the hole pattern H (see FIG. 2), so that the light can be emitted from only the active layer 114. Accordingly, the column pattern B or the hole pattern H may serve as a single resonant cavity for the light emitted from the active layer 114 provided below the column pattern B or the hole pattern H, so that the light extraction efficiency can be improved through the resonant cavity effect.

According to the embodiment, the column (or hole) pattern and the current density adjusting pattern are provided over whole area of the device in the form of predetermined patterns, which may be recognized as if a plurality of resonant cavity light emitting devices are provided separated from each other.

According to the embodiment, the variation in the light emission distribution according to the existence of the resonant cavity structure such as a column (or hole) pattern may be simulated based on an electromagnetic equation.

Figure 3:
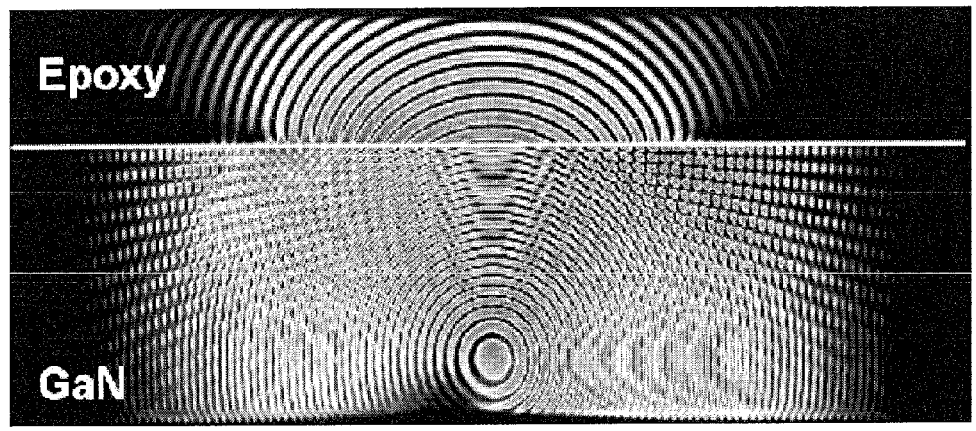
FIG. 3 is a view showing the light emission distribution when the structure of the resonant cavity is not used.

FIG. 3 is a view showing the light emission distribution when the structure of the resonant cavity is not used. Referring to FIG. 3, when the structure of the resonant cavity is not used, the spherical wave without the directionality is propagated along a medium.

Figure 4:
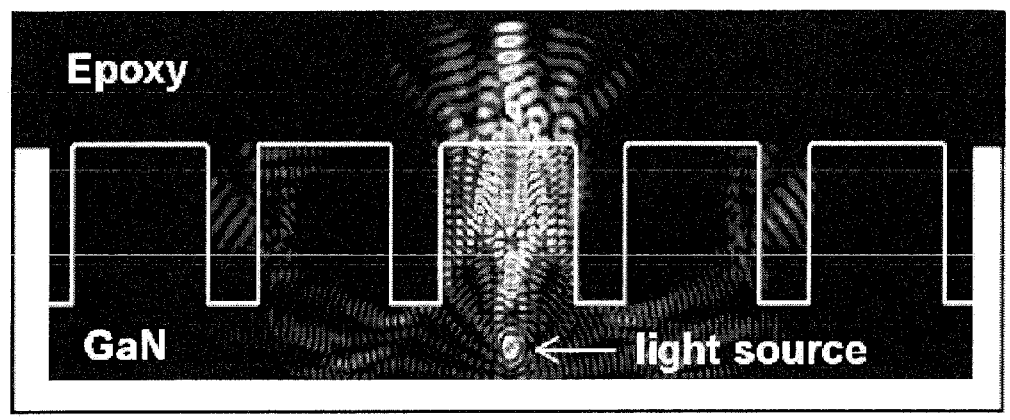
FIG. 4 is a view showing the light emission distribution when the structure of the resonant cavity is used in the light emitting device according to the embodiment.

In contrast, FIG. 4 is a view showing the light emission distribution when the structure of the resonant cavity is used in the light emitting device according to the embodiment. Referring to FIG. 4, if the column (or hole) pattern is close to the active layer 114, the light emission distribution varies, and a light is extracted in a vertical direction along the inner part of the column (or hole) pattern. As shown in the simulation of FIG. 4, a light source is provided below the center of the column pattern B in order to represent a local current by the current density adjusting pattern 120.

Figure 5:
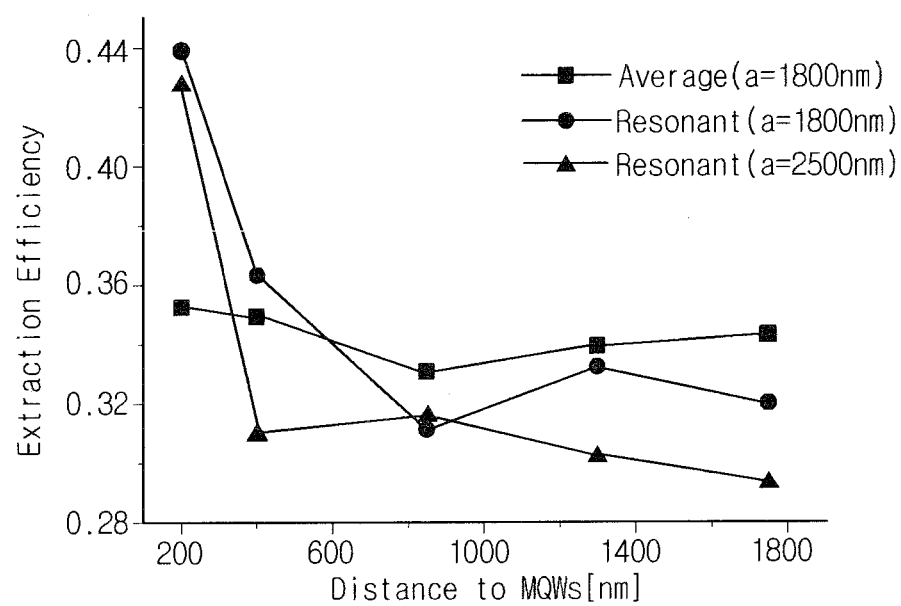
FIG. 5 is a graph showing simulation results for the variation of the light extraction efficiency as a function of the thickness from an active layer of FIG. 1 to the bottom surface of a column pattern when light sources are provided below the column pattern, which is the structure of the resonant cavity having the period of about 1800 nm and about 2500 nm, Resonant case, when light sources are provided throughout the whole region of the active layer or when the structure of the resonant cavity is not provided, Average case.

FIG. 5 is a graph showing simulation results for the variation of the light extraction efficiency as a function of the thickness h1 from the active layer 114 of FIG. 1 to the bottom surface of the column pattern B when light sources are provided below the column pattern B which is the structure of the resonant cavity having the period a of about 1800 nm and about 2500 nm, Resonant case, when light sources are provided throughout the whole region of the active layer 114 or when the structure of the resonant cavity does not exist, Average case.

In this case, when the thickness h2 of the light emitting structure 110 is about 3 μm, and when the thickness h1 is in the range of about 2 μm to about 10 μm, similar simulation results can be obtained. In addition, the active layer 114 emits a blue-based light having a main wavelength band of approximately 460 nm.

Referring to FIGS. 1 and 5, in the case of the light emitting device in which the light sources are provided throughout the whole region of the active layer or the structure of the resonant cavity is not used (Average case), the light extraction efficiency can be more uniformly represented.

In contrast, according to the embodiment, in the case of the light emitting device having the structure of the resonant cavity, as the thickness h1 from the active layer 114 to the bottom surface of the column pattern B is shortened, the light extraction efficiency is increased.

In particular, when the thickness h1 corresponds to the wavelength value (λ460 nm) of the light generated from the active layer 114, or the thickness h1 is less than the wavelength value of the light from the active layer 114, that is, has the value in the range of about 200 nm to about 400 nm, the light extraction efficiency can be rapidly increased. In addition, when the structure of the resonant cavity has a great period a, that is, when the period a is about 2500 nm rather than about 1800 nm, the light extraction efficiency can be more increased.

However, if the thickness h1 is in the range of about 200 nm to about 400 nm, the light emitting structure 110 must be etched up to the position very close to the active layer 114. Accordingly, the etching depth cannot be accurately controlled, so that the active layer 114 may be removed. Therefore, the reliability of the fabricating process and the product yield cannot be ensured.

Therefore, according to another embodiment, in order to more greatly ensure the thickness h1 from the active layer 114 from the bottom surface of the column pattern B while increasing the light extraction efficiency through the structure of the resonant cavity, the whole thickness h2 of the light emitting structure 110 may be formed to about 2 μm, and preferably, formed in the range of about 1 μm to about 2 μm. More preferably, the whole thickness h2 of the light emitting structure 110 may be formed in the range of about 1.3 μm to about 1.8 μm.

Figure 6:
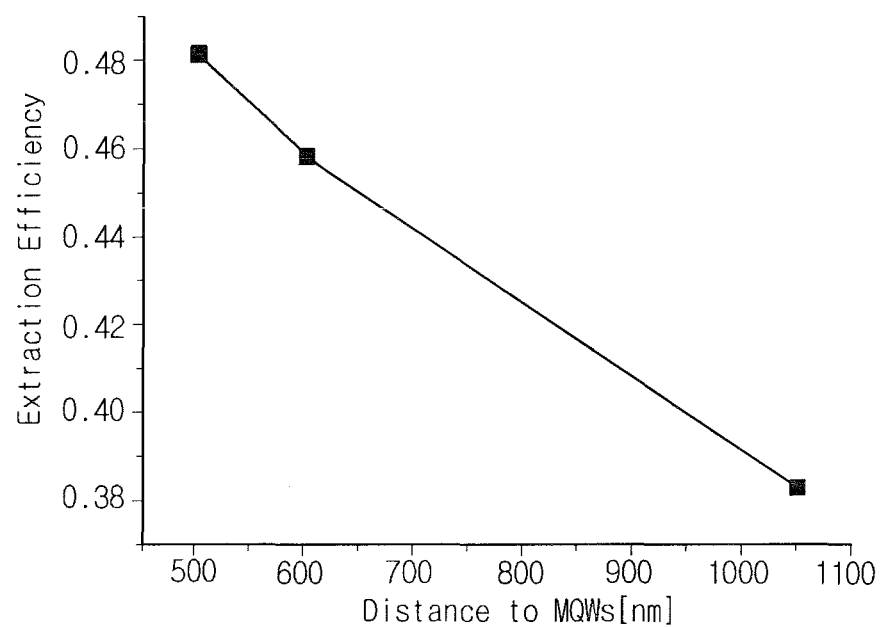
FIG. 6 is a graph showing a simulation result for the variation of the light extraction efficiency as a function of the thickness from an active layer of FIG. 1 to the bottom surface of the column pattern when light sources are provided below the column pattern which is the structure of the resonant cavity having the period of about 1800 nm.

FIG. 6 is a graph showing a simulation result for the variation of the light extraction efficiency as a function of the thickness h1 from the active layer 114 of FIG. 1 to the bottom surface of the column pattern B when light sources are provided below the column pattern B which is the structure of the resonant cavity having the period of about 1800 nm.

The simulation is represented with respect to the light emitting structure 110 having the thickness h2 of about 1.5 μm. However, even if the thickness h2 is in the range of about 1 μm to about 2 μm, a simulation result is represented. In addition, the active layer 114 emits a blue-based light having a main wavelength band of about 460 nm.

Referring to FIGS. 1 and 6, when the thickness h2 of the light emitting structure 110 is about 1.5 μm, and the thickness h1 from the active layer 114 to the bottom surface of the column pattern B is in the range of about 500 nm to 1000 nm (which are greater than the thickness h1 in the simulation results of FIG. 5), preferably, in the range of about 500 nm to about 700 nm, light extraction efficiency can be more highly represented.

In other words, the thickness h2 of the light emitting structure 110 is reduced, so that the characteristic of the thin film can be represented. Accordingly, the thickness h1 from the active layer 114 to the bottom surface of the column pattern B, which is required to represent the effect of the resonant cavity, can be more increased. Therefore, the light extraction efficiency can be increased due to the effect of the resonant cavity. In addition, the reliability for the fabricating process of the light emitting device can be ensured.

In other words, this is because an amount of light confined in the light emitting structure 110 due to the total reflection is reduced by reducing the thickness h2 of the light emitting structure 110, and an amount of light causing the interference due to the vibration mode in the vertical direction is increased.

Referring to FIGS. 1 and 2 again, according to the embodiment, in order to obtain the effect of the resonant cavity, the column pattern B or the hole pattern H, which is the structure of the resonant cavity, may form an out-of-phase or an in-phase with respect to the current density adjusting pattern 120.

Figure 1A:
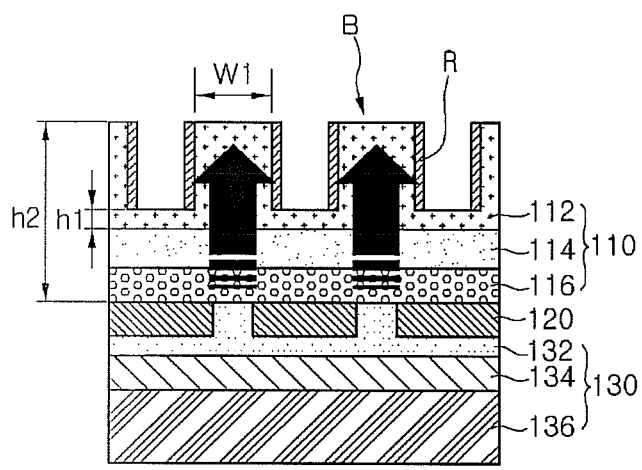
Figure 2A:
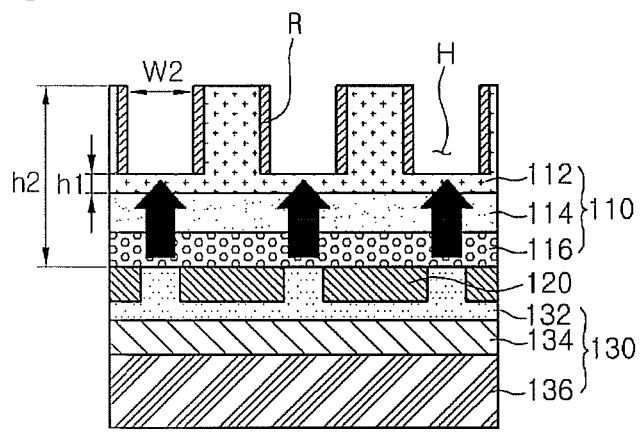

Meanwhile, according to the embodiment, the column pattern B or the hole pattern H, which is the structure of the resonant cavity, may not perfectly form the out-of-phase relationship or the in-phase relationship with respect to the current density adjusting pattern 120. In addition, the width of the current density adjusting pattern 120 may be less than or greater than the width W1 of the column pattern B or the width W2 of the hole pattern H, as shown in FIG. 1A and FIG. 2A.

In other words, according to the embodiment, when the current density adjusting pattern 120 of adjusting current density is properly positioned, the effect of the resonant cavity can be obtained, but the embodiment is not limited thereto.

In addition, as described above, if the thickness h1 between the bottom surface of the column pattern B or the hole pattern H and the active layer 114 is excessively thick, the active layer 114 cannot obtain the effect of the resonant cavity. In addition, if the thickness h1 between the bottom surface of the column pattern B or the hole pattern H and the active layer 114 is excessively thin, the thickness of the first conductive semiconductor layer 112, for example, the thickness of an n-GaN layer is reduced, so that problems may occur in the current diffusion.

Therefore, the thickness h1 between the bottom surface of the column pattern B or the hole pattern H and the active layer 114 may have the minimum value of about 10 nm. In addition, the etching depth of the column pattern B or the hole pattern H is preferably at least λ/n (wherein the λ and the n represent a main wavelength of a light emitted from the active layer 114 and the refractive index of the light emitting structure 110).

The embodiment is designed to allow a current to flow within a specific region, so that the active layer 114 in the region obtains the effect of the resonant cavity. If the current uniformly flows throughout the whole light emitting region, the emission efficiency can be uniformly maintained regardless of the etching rate similarly to the data in "Average" of FIG. 5.

In the arithmetic description about the localization degree of a current, on the assumption that a current does not flow within the active layer 114 formed above the current density adjusting pattern 120 in the ideal case, a current may flow in at most 50% of a sectional area of the lower portion of the current density adjusting pattern 120 which is perpendicular to the active layer 114.

Hereinafter, a method of fabricating the light emitting device according to the embodiment will be described with reference to FIGS. 7 to 15. Although a method of fabricating a light emitting device according to a first embodiment is described below, the embodiment is not limited thereto. For example, a method of fabricating a light emitting device according to a second embodiment is applicable.

Figure 7:
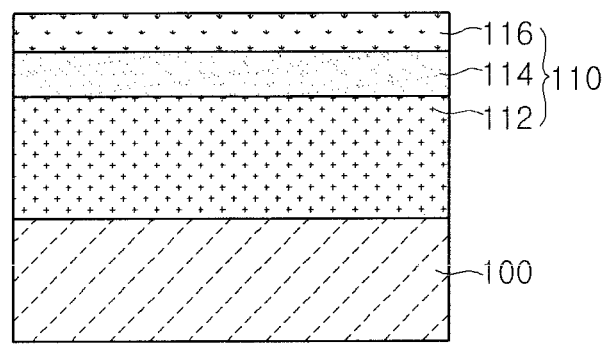
FIGS. 7 to 15 are views showing a method of fabricating the light emitting device according to the embodiment.

Referring to FIG. 7, the light emitting structure 110 comprising the first conductive semiconductor layer 112, the active layer 114, and the second conductive semiconductor layer 116 is formed on a substrate 100. An undoped semiconductor layer and a buffer layer may be interposed between the substrate 100 and the first conductive semiconductor layer 112.

The substrate 100 may comprise at least one selected from the group consisting of a sapphire ($Al_2O_3$) crystalline substrate, SiC, GaAs, GaN, ZnO, Si, GaP, InP, and Ge, but the embodiment is not limited thereto.

Impurities existing on the surface of the substrate 100 can be removed by wet-washing the substrate 100. In addition, in order to accelerate the growth of the semiconductor layers, various pattern may be formed on the top surface of the substrate 100, or the top surface of the substrate 100 may be inclined.

The light emitting structure 110, the undoped semiconductor layer, and the buffer layer may be formed on the substrate 100 through at least one of an MOCVD (Metal Organic Chemical Vapor Deposition) scheme, a CVD (Chemical Vapor Deposition) scheme, a PECVD (Plasma-Enhanced Chemical Vapor Deposition) scheme, an MBE (Molecular Beam Epitaxy) scheme and an HVPE (Hydride Vapor Phase Epitaxy) scheme, but the embodiment is not limited thereto.

For example, the first conductive semiconductor layer 112 may comprise an N type semiconductor layer. The N type semiconductor layer may comprise a semiconductor material having a compositional formula of $In_xAl_yGa_{1-x-y}N$ ($0 \leq x \leq 1$, $0 \leq y \leq 1$, and $0 \leq x+y \leq 1$). For example, the N type semiconductor layer may comprise one selected from the group consisting of InAlGaN, GaN, AlGaN, AlInN, InGaN, AlN, and InN, and may be doped with N type dopants such as Si, Ge, and Sn.

The active layer 114 may comprise at least one of a single quantum well structure, a multiple quantum well (MQW)

structure, a quantum wire structure or a quantum dot structure. The active layer 114 may have the stack structure of well/barrier layers comprising a group III to V compound semiconductor material. For example, the active layer 114 may comprise at least one of an InGaN/GaN structure, an InGaN/AlGaN structure, and an InGaN/InGaN structure. The barrier layer may comprise a material having the bandgap greater than that of a material constituting the well layer, but the embodiment is not limited thereto. The active layer 114 may comprise a semiconductor material having a compositional formula of $In_xAl_yGa_{1-x-y}N$ ($0 \leq x \leq 1$, and $0x+y \leq 1$). The active layer 114 may generate a light by energy generated in the recombination process of electrons and holes supplied from the first and second conductive semiconductor layers 112 and 116.

For example, the second conductive semiconductor layer 116 may comprise a P type semiconductor layer. The P type semiconductor layer may comprise a semiconductor material having a compositional formula of $In_xAl_yGa_{1-x-y}N$ ($0 \leq x \leq 1$, $0 \leq y \leq 1$, and $0 \leq x+y \leq 1$). For example, the P type semiconductor layer may comprise a material selected from the group consisting of InAlGaN, GaN, AlGaN, AlInN, InGaN, AlN, and InN, and may be doped with P type dopants such as Mg, Zn, Ca, Sr, and Ba.

Since the undoped semiconductor layer is doped with conductive dopants, the undoped semiconductor layer has electrical conductivity remarkably lower than that of the first and second conductive semiconductor layers 112 and 116. The undoped semiconductor layer may be formed for the purpose of improving a crystalline property and reducing lattice mismatch. The buffer layer may have a lattice constant that is an intermediate value between the lattice constant of the light emitting structure 110 and the substrate 110, thereby reducing the lattice mismatch between the light emitting structure 110 and the substrate 100.

Figure 8:
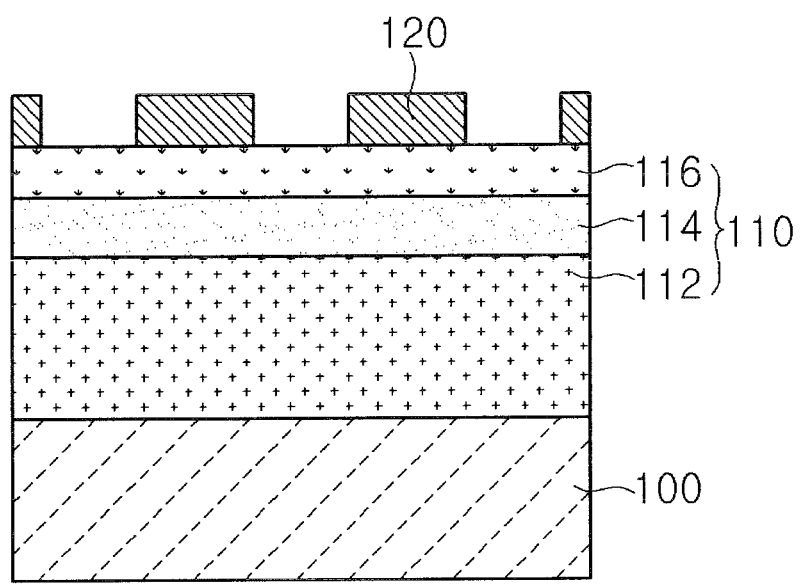

Referring to FIG. 8, the current density adjusting pattern 120 may be formed on the second conductive semiconductor layer 116. For example, the current density adjusting pattern 120 may be formed by performing an etching process after a dielectric layer or a non-ohmic metallic layer is formed and the first mask pattern is formed.

The current density adjusting pattern 120 may comprise a non-conductive material that does not flow a current. For example, the current density adjusting pattern 120 may comprise an oxide layer or a nitride layer.

The current density adjusting pattern 120 may comprise a metallic material making non-ohmic contact with respect to the second conductive semiconductor layer 116. However, the current density adjusting pattern 120 may comprise various materials. For example, the current density adjusting pattern 120 may comprise a current blocking layer based on the schottky contact with respect to the non-ohmic metallic layer in order to prevent a current from flowing into the second conductive semiconductor layer 116.

Meanwhile, the current density adjusting pattern 120 may be formed at a position of forming an out-of-phase or an in-phase with respect to the column pattern B to be formed thereafter.

Figure 9:
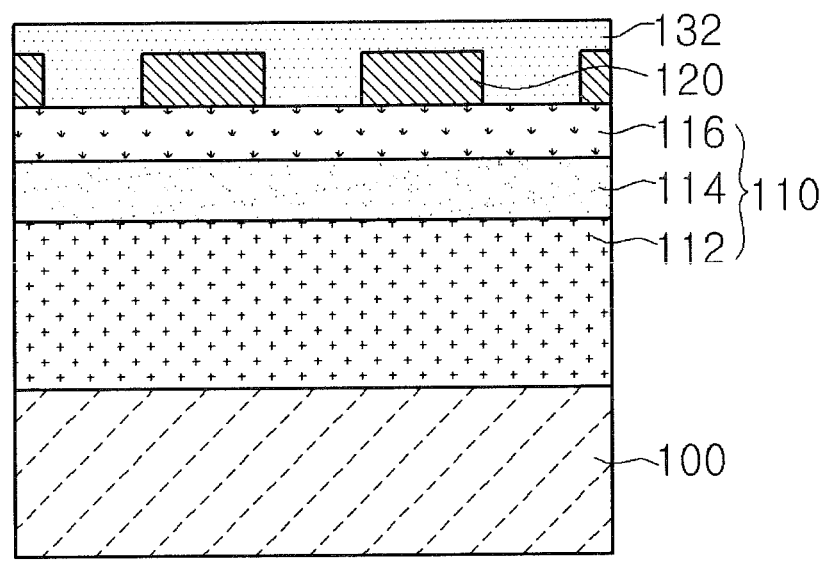
Figure 10:
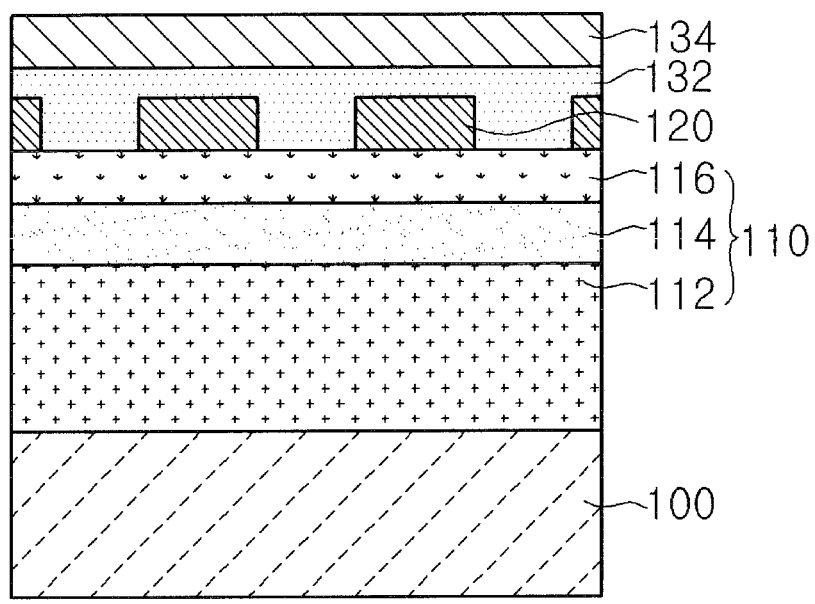
Figure 11:
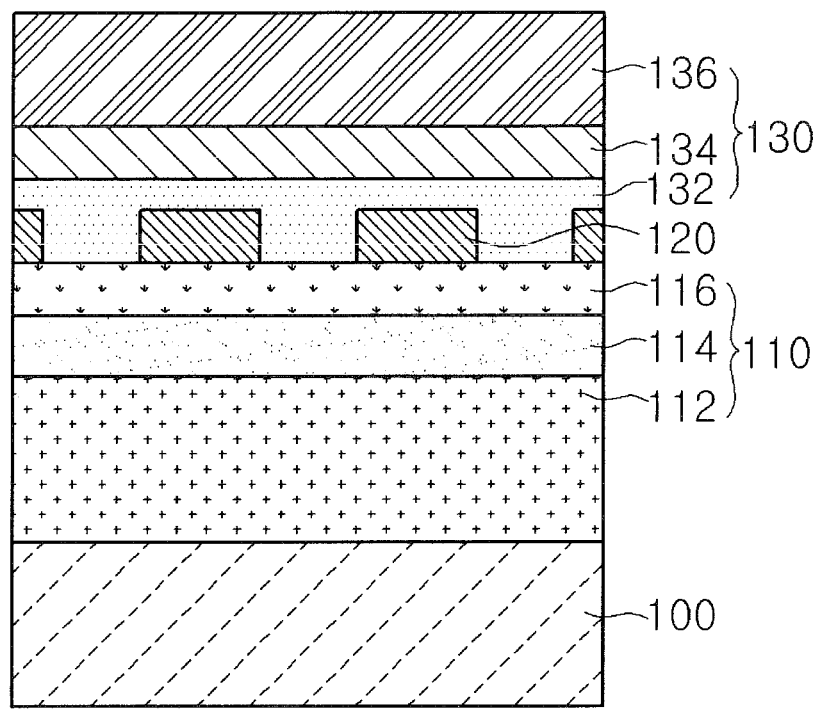

Referring to FIGS. 9 to 11, the electrode layer 130 may be formed on the second conductive semiconductor layer 116 and the current density adjusting pattern 120.

The electrode layer 130 may comprise the ohmic layer 132, the reflective layer 134, an adhesive layer, and the conductive support member 136.

First, as shown in FIG. 9, the ohmic layer 132 may be formed on the current density adjusting pattern 120 and the second conductive semiconductor layer 116.

The ohmic layer 132 may comprise a material selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO. In addition, the ohmic layer 132 may comprise a material selected from the group consisting of Ag, Ni, Al, Rh, Pd, Ir, Ru, Mg, Zn, Pt, Au, Hf, and the combination thereof.

Next, as shown in FIG. 10, the reflective layer 134 may be further formed on the ohmic layer 132 to reflect a light. The reflective layer 134 may comprise at least one selected from the group consisting of Al, Ag, Pt, Pd and Cu, or the alloy thereof, but the embodiment is not limited thereto.

Subsequently, as shown in FIG. 11, the conductive support member 136 may be formed on the reflective layer 134. However, if the first conductive semiconductor layer 112 has a sufficient thickness of about 50 µm or more, the process of forming the conductive support member 136 may be omitted.

The conductive support member 136 may comprise metal having superior electrical conductivity, the alloy thereof, or a conductive semiconductor material such that holes can be effectively injected. For example, the conductive support member 136 may comprise at least one selected from the group consisting of titan (Ti), chrome (Cr), nickel (Ni), aluminum (Al), platinum (Pt), gold (Au), tungsten (W), copper (Cu), molybdenum (Mo), copper-tungsten (Cu—W) and a carrier wafer, which is a semiconductor substrate doped with impurities, such as Si, Ge, GaN, GaAs, ZnO, SiC, SiGe, etc. The conductive support member 136 may be formed through an electrochemical metal deposition scheme or a bonding scheme using eutectic metal.

The adhesive layer may be further formed between the conductive support member 136 and the reflective layer 134 to improve the interfacial adhesion strength between the two layers. The adhesive layer may have a single layer structure or a multiple layer structure comprising at least one selected from the group consisting of Ti, Au, Sn, Ni, Cr, Ga, In, Bi, Cu, Ag and Ta.

Figure 12:
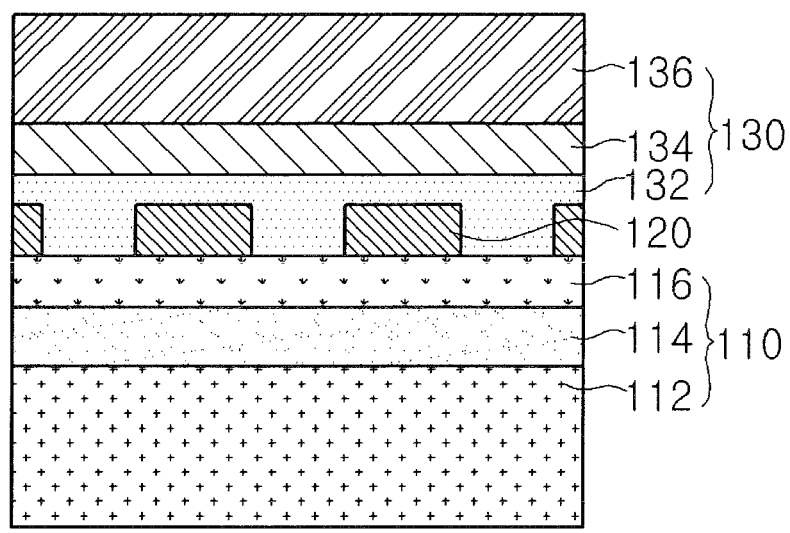

Referring to FIG. 12, the substrate 100 may be removed such that the first conductive semiconductor layer 112 can be exposed.

The substrate 100 may be removed through a LLO (Laser Lift Off) process using a high-power laser or a CLO (Chemical Lift Off) process. In addition, the substrate 100 may be physically ground so that the substrate 100 can be removed.

Figure 13:
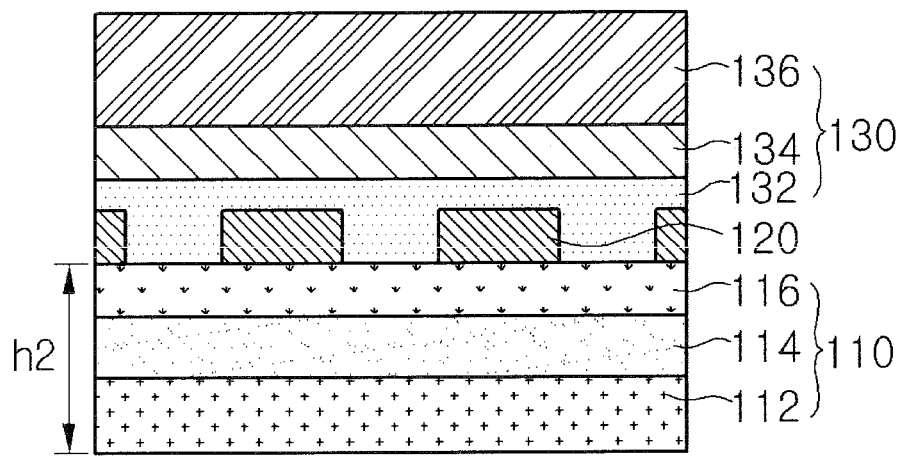

Referring to FIG. 13, a thinning process may be performed with respect to the first conductive semiconductor layer 112 exposed as the substrate 100 is removed so that the first conductive semiconductor layer 112 may be thinned. As described above, in order to obtain the effect of the resonant cavity, it is advantageous that the whole thickness h2 of the light emitting structure 110 is reduced.

In the thinning process for the first conductive semiconductor layer 112, a CMP (Chemical Mechanical Polishing) scheme may be applied thereto, but the embodiment is not limited thereto.

Through the thinning process, the whole thickness h2 of the light emitting structure 110 may be about 2 µm or less, preferably, in the range of about 1 µm to about 2 µm. More preferably, the light emitting structure 110 may be in the range of about 1.3 µm to about 1.8 µm. However, the embodiment is not limited thereto.

Figure 14:
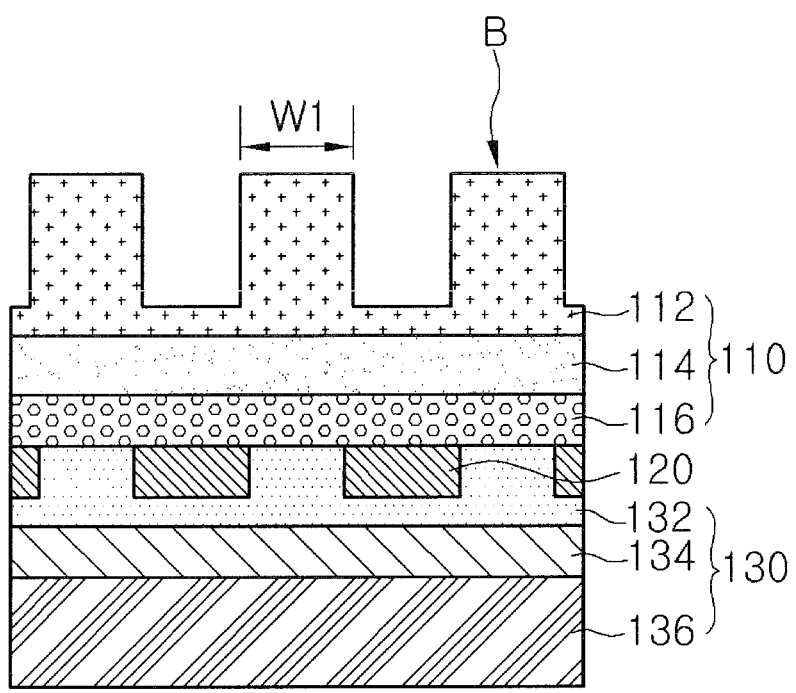

Referring to FIG. 14, the structure of the resonant cavity is formed in the light emitting structure 110.

For example, the structure of the resonant cavity may be formed at the upper portion of the first conductive semiconductor layer 112, but the embodiment is not limited thereto. For example, the structure of the resonant cavity may be formed in the undoped semiconductor layer, or may be formed in both the undoped semiconductor layer and the first conductive semiconductor layer 112.

The structure of the resonant cavity may comprise the column pattern B, but the embodiment is not limited thereto. According to the second embodiment, the structure of the resonant cavity may comprise the hole pattern H.

In order to form the structure of the resonant cavity, after forming a second mask pattern, a portion of the first conductive semiconductor layer 112 may be removed by using the second mask pattern. For example, an etching process may be performed in such a manner that the first conductive semiconductor layer 112 forms an out-of-phase with respect to the current density adjusting pattern 120 remains. According to the second embodiment, the etching process may be performed in such a manner that the first conductive semiconductor layer 112 forming an in-phase with respect to the current density adjusting pattern 120 remains.

Meanwhile, an insulating layer may be formed at a lateral side of the column pattern B or the hole pattern H in order to prevent a current from leaking. The insulating layer may comprise a material selected from the group consisting of an oxide, a nitride, a fluoride-based compound, and a complex layer.

In addition, according to the embodiment, a roughness structure or a periodical concave-convex structure may be formed on the column pattern B or the hole pattern H.

For example, the roughness structure or the periodical concave-convex structure may be formed on the column pattern B or at a space between column patterns B, but the embodiment is not limited thereto.

The average size of the roughness structure or the periodical concave-convex structure may be less than the size of the column pattern B and the space between the column patterns B.

In addition, according to the embodiment, a reflective layer (R) may be further formed on the lateral side of the column pattern B or the hole pattern H in order to maximize the effect of the resonant cavity as shown in FIG. 1A and FIG. 2A. The reflective layer (R) may comprise at least one selected from the group consisting of Ag, Al, Au, Pt, Ti, Cr, Pd and Cu, but the embodiment is not limited thereto.

Figure 15:
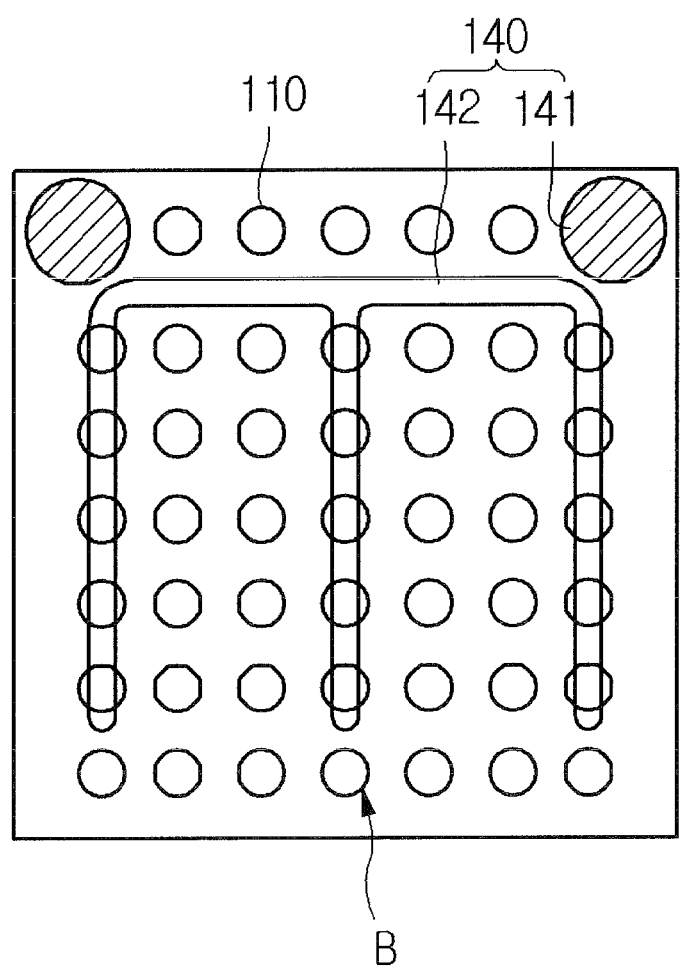

Referring to FIG. 15, an electrode 140 may be formed on the first conductive semiconductor layer 112.

The electrode 140 may comprise an electrode pad 141 bonded to a wire and a spreading pattern 142 to uniformly spread the power delivered from the electrode pad 141 to the whole region of the light emitting structure 110.

The electrode pad 141 may have a single layer structure or a multiple layer structure including at least one selected from the group consisting of Au, Sn, Ti, Cu, Ni, and Cr representing superior adhesion strength.

The spreading pattern 142 may comprise a transparent electrode. The spreading pattern 142 may comprise at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO.

The electrode 140 may be formed on the top surface of the light emitting structure 110, but the embodiment is not limited thereto.

According to the light emitting device and the method of fabricating the same of the embodiment, light extraction efficiency can be improved due to the effect of the resonant cavity based on the adjustment of the current density.

In addition, the embodiment provides a resonant cavity light emitting device based on the adjustment of current density to improve light extraction efficiency through the cooperation with the vertically-directional vibration mode in the structure of the resonant cavity. Accordingly, a light emission pattern concentrated in the vertical direction can be obtained.

Figure 16:
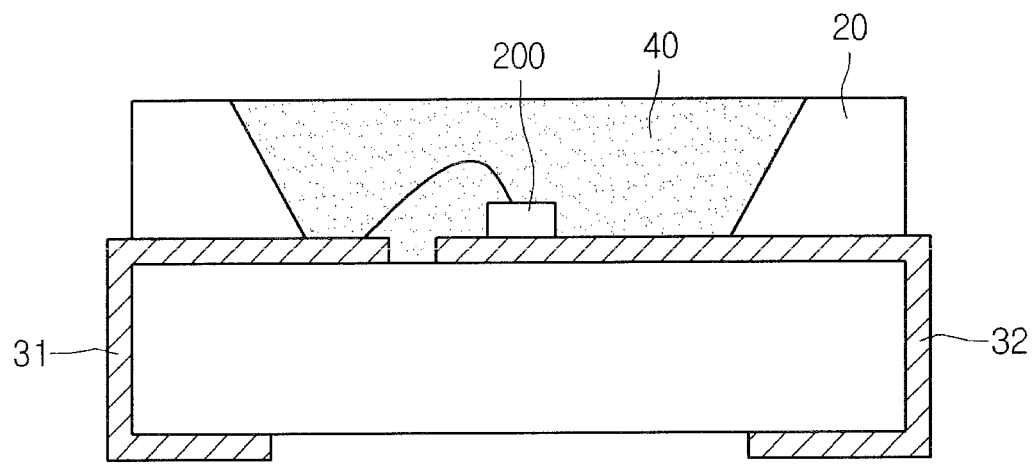
FIG. 16 is a sectional view showing a light emitting device package comprising a light emitting device according to the embodiment.

FIG. 16 is a sectional view showing a light emitting device package comprising the light emitting device according to the embodiment.

Referring to FIG. 16, the light emitting device package according to the embodiment comprises a body 20, first and second lead electrodes 31 and 32 formed on the body 20, a light emitting device 200 provided on the body 20 and electrically connected to the first and second lead electrodes 31 and 32 and a molding member 40 that surrounds the light emitting device 200.

The body 20 may comprise silicon, synthetic resin or metallic material. The lateral sides of the light emitting device 200 may be inclined.

The first and second lead electrodes 31 and 32 are electrically isolated from each other to supply power to the light emitting device 200. In addition, the first and second lead electrode 31 and 32 improve the light efficiency by reflecting the light emitted from the light emitting device 200. Further, the first and second lead electrodes 31 and 32 dissipate heat generated from the light emitting device 200 to the outside.

The light emitting device 200 may be provided on the body 20 or the first or second lead electrode 31 or 32.

The light emitting device 200 may be electrically connected to the first and second lead electrodes 31 and 32 through one of a wire scheme, a flip-chip scheme, and a die-bonding scheme.

The molding member 40 may surround the light emitting device 200 to protect the light emitting device 200. In addition, the molding member 40 may comprise a luminescence material to change the wavelength of the light emitted from the light emitting device 200.

At least one lens may be formed on the molding member or the body 20. The lens may comprise a convex lens, a concave lens, or a lens having a concavo-convex structure.

The light emitting device according to the embodiment (embodiments) may be packaged on a board or provided in the light emitting device package, so that the light emitting device may be used as a light source of an indicator, a lighting apparatus, and a display apparatus. The light emitting device according to the embodiment or the light emitting device package may be applicable to a light unit. The light unit may have a structure in which a plurality of light emitting device packages are arrayed, and may comprise a side-view type light source or a top-view type light source. Such a light source can supply a light to a backlight unit of a display panel. The light emitting device or the light emitting device package is applicable to a light source of a lighting apparatus, and the lighting apparatus may comprise a lighting lamp, a signal lamp, a headlight of a vehicle, and an electric signboard.

A semiconductor light emitting device according to the embodiment (embodiments) may be packaged on a resin material, a semiconductor substrate such as a silicon substrate, an insulating substrate, or a ceramic substrate, and may be used as a light source of an indicator, a lighting apparatus, and a display apparatus. In addition, each embodiment is selectively applicable to another embodiment.

The light emitting device package according to the embodiment is applicable to the light unit. The light unit may have a structure in which a plurality of light emitting device packages may be arrayed.

Figure 17:
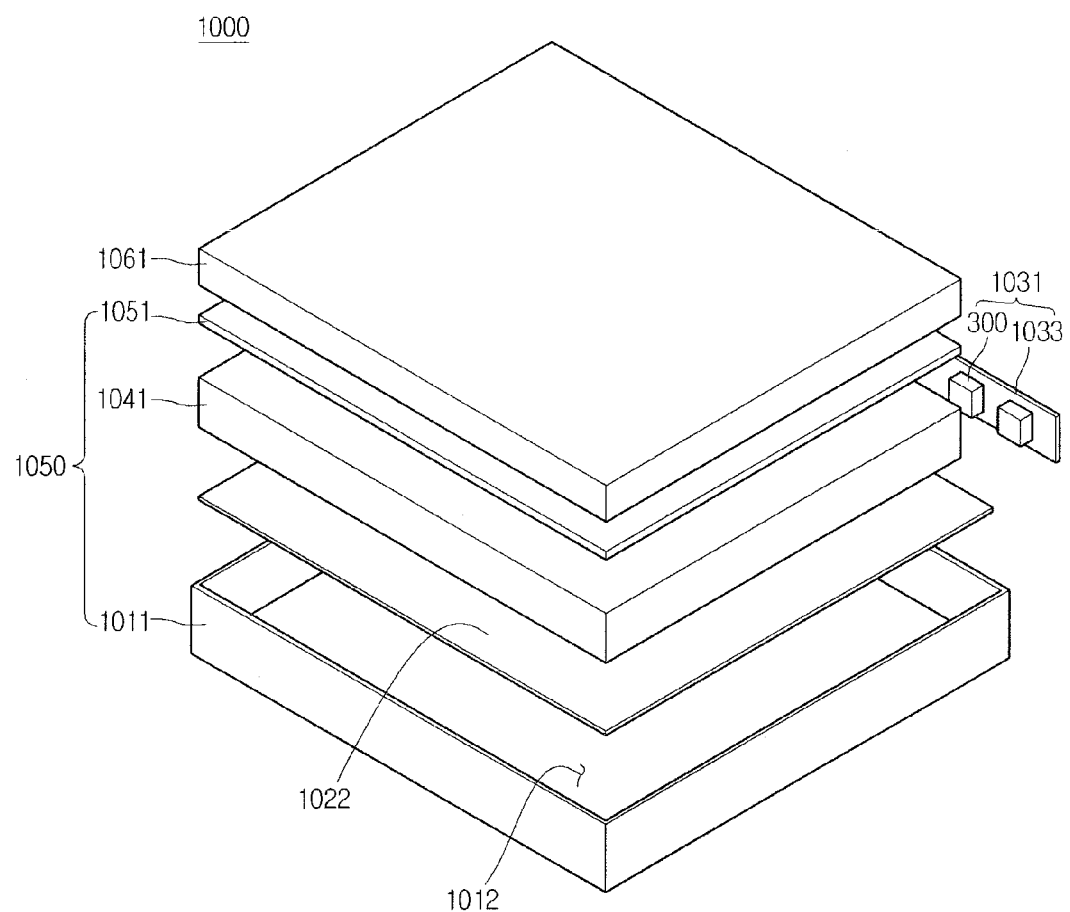
FIG. 17 is a view showing a display apparatus according to the embodiment.

FIG. 17 is an exploded perspective view showing a display apparatus according to the embodiment.

Referring to FIG. 17, the display apparatus 1000 according to the embodiment comprises a light guide plate 1041, a light emitting module 1031 for supplying the light to the light guide plate 1041, a reflective member 1022 provided below the light guide plate 1041, an optical sheet 1051 provided on the light guide plate 1041, a display panel 1061 provided on the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041, and the optical sheet 1051 may constitute a light unit 1050.

The light guide plate 1041 diffuses the light to provide surface light. The light guide plate 1041 may comprise transparent material. For instance, the light guide plate 1041 may comprise one of acryl-based resin such as PMMA (polymethyl methacrylate), PET (polyethylene terephthalate), PC (polycarbonate), COC (cyclic olefin copolymer) and PEN (polyethylene naphthalate) resin.

The light emitting module 1031 is disposed in at one side of the light guide plate 1041 to serve as the light source of the display apparatus.

At least one light emitting module 1031 is provided to directly or indirectly supply the light from one side of the light guide plate 1041. The light emitting module 1031 may comprise a board 1033 and a light emitting device package 300 according to the embodiment. The light emitting device and the light emitting device package 300 are arrayed on the board 1033 while being spaced apart from each other at the predetermined interval. In other words, light emitting devices may be arrayed on the board 1033 in the form of a chip or a package.

The board 1033 may comprise a printed circuit board (PCB) having a circuit pattern. In addition, the substrate 1033 may comprise a metal core PCB (MCPCB) or a flexible PCB (FPCB) as well as a typical PCB, but the embodiment is not limited thereto. If the light emitting device package 300 is provided on the side of the bottom cover 1011 or on a heat dissipation plate, the board 1033 may be omitted. The heat dissipation plate partially makes contact with the top surface of the bottom cover 1011.

In addition, the light emitting device package 300 is arranged on the board 1033 such that a light exit surface of the light emitting device package 300 is spaced apart from the light guide plate 1041 by a predetermined distance, but the embodiment is not limited thereto. The light emitting device package 300 may directly or indirectly supply the light to a light incident surface, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For instance, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an open top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for instance, is an LCD panel comprising first and second transparent substrates, which are opposite to each other and comprise a liquid crystal layer interposed between the first and second substrates. A polarizing plate may be attached to at least one surface of the display panel 1061, but the embodiment is not limited thereto. The display panel 1061 displays information by a light passing through an optical sheet 1051. The display apparatus 1000 may be applied to various portable terminals, monitors of notebook computers, monitors of laptop computers, and televisions.

The optical sheet 1051 may be disposed between the display panel 1061 and the light guide plate 1041 and comprise at least one transmissive sheet. For instance, the optical sheet 1051 may comprise at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 may be provided in the light path of the light emitting module 1031 as optical members, but the embodiment is not limited thereto.

Figure 18:
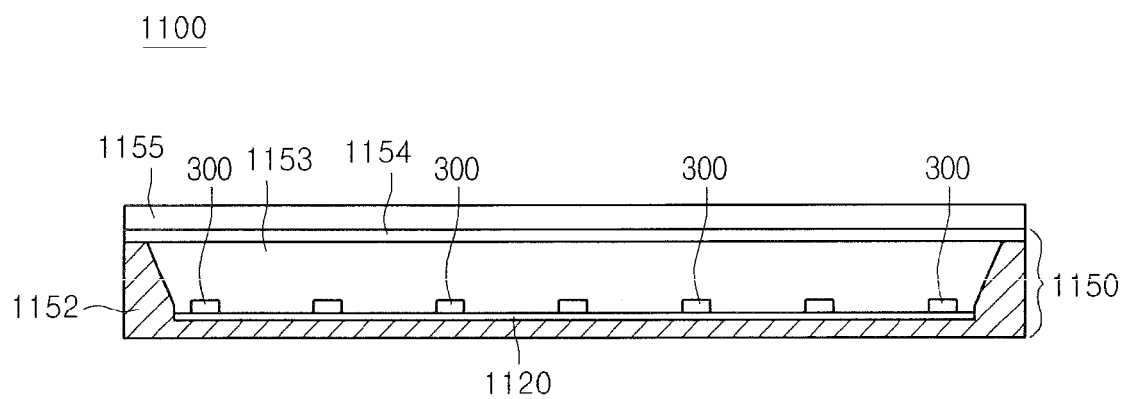
FIG. 18 is a view showing another example of the display apparatus according to the embodiment.

FIG. 18 is a sectional view showing the display apparatus according to the embodiment. The package disclosed in the description referring to FIG. 18 comprises light emitting devices arrayed in the form of a chip or a package.

Referring to FIG. 18, the display apparatus 1100 comprises a bottom cover 1152, a board 1120 on which light emitting device packages 300 are arrayed, an optical member 1154, and a display panel 1155.

The board 1120 and the light emitting device packages 300 may constitute the light emitting module 1031. In addition, the bottom cover 1152, at least one light emitting module 1031, and the optical member 1154 may constitute the light unit. Light emitting devices may be arrayed on the board 1120 in the form of a chip or a package.

The bottom cover 1151 can be provided with a receiving section 1153, but the embodiment is not limited thereto.

The optical member 1154 may comprise at least one of a lens, a light guide plate, a diffusion sheet, a horizontal and vertical prism sheet, and a brightness enhanced sheet. The light guide plate may comprise PC or PMMA (Poly methyl methacrylate). The light guide plate may be omitted. The diffusion sheet diffuses the incident light, the horizontal and vertical prism sheet concentrates the incident light onto the display panel 1155, and the brightness enhanced sheet improves the brightness by reusing the lost light.

Figure 19:
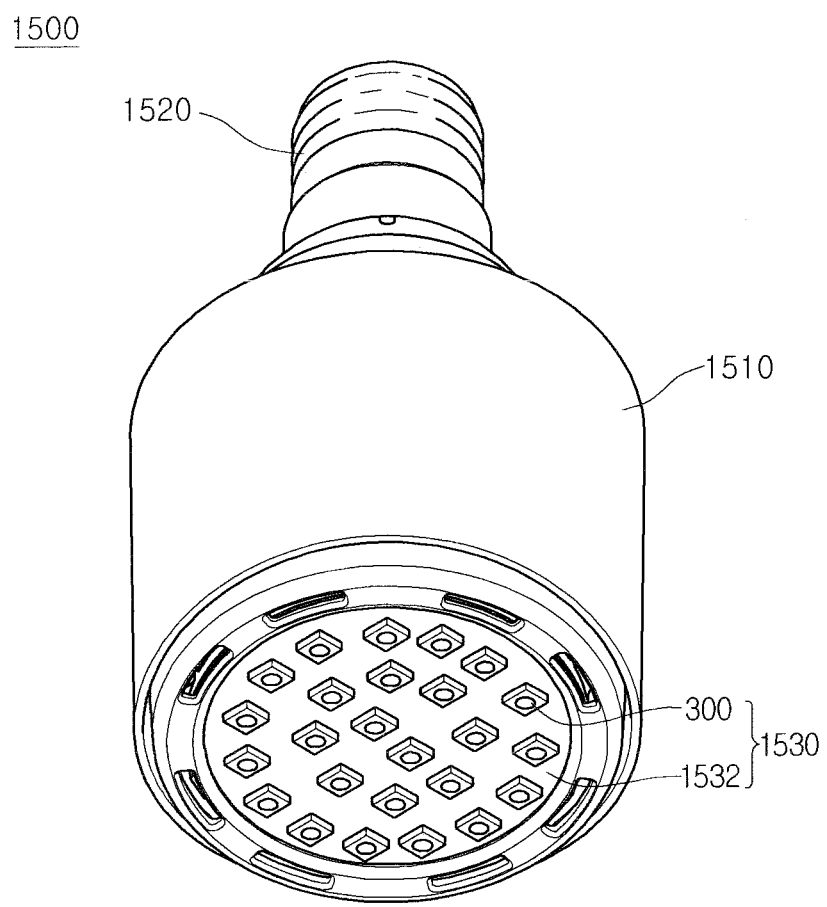
FIG. 19 is a view showing a light unit according to the embodiment.

FIG. 19 is a perspective view showing a lighting system 1500 according to the embodiment.

Referring to FIG. 19, the lighting system 1500 may comprise a case 1510, a light emitting module 1530 provided in the case 1510, and a connection terminal 1520 provided in the case 1510 to receive power from an external power source.

Preferably, the case 1510 may comprise material having superior heat dissipation property. For instance, the case 1510 may comprise metallic material or resin material.

The light emitting module 1530 may comprise a board 1532 and a light emitting device and light emitting device package 200 according to the embodiment provided on the board 1532. The light emitting device packages 300 are spaced apart from each other or arrayed in the form of a matrix. Light emitting devices may be arrayed on the board 1532 in the form of a chip or a package.

The board 1532 may comprise an insulating member printed with a circuit pattern. For instance, the board 1532 may comprise at least one of a PCB, an MCPCB, an FPCB, a ceramic PCB, and an FR-4 substrate.

In addition, the board 1532 may comprise material that effectively reflects the light. A coating layer may be formed on the surface of the board 1532. At this time, the coating layer has a white color or a silver color to effectively reflect the light.

At least one light emitting device package 300 may be provided on the board 1532. Each light emitting device package 300 may comprise at least one LED (light emitting diode) chip. The LED chip may comprise an LED that emits the light of visible ray band having red, green, blue or white color and a UV (ultraviolet) LED that emits UV light.

The light emitting device packages 300 of the light emitting module 1530 may be variously arranged to provide various colors and brightness. For instance, the white LED, the red LED and the green LED may be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
an electrode layer;
a current density adjusting pattern on the electrode layer; and
a light emitting structure on the electrode layer and the current density adjusting pattern, the light emitting structure having a thickness less than about 2 μm,
wherein a column pattern or a hole pattern serving as a structure of a resonant cavity is formed at an upper portion of the light emitting structure, and
wherein the column pattern or the hole pattern vertically overlaps with respective ones of the current density adjusting pattern.

2. The light emitting device of claim 1, wherein the light emitting structure comprises a second conductive semiconductor layer, an active layer on the second conductive semiconductor layer, and a first conductive semiconductor layer on the active layer, and wherein the column pattern or the hole pattern is formed at an upper portion the first conductive semiconductor layer.

3. The light emitting device of claim 2, wherein the first conductive semiconductor layer has a first thickness to provide the column pattern or the hole pattern and a second thickness formed under the column pattern or the hole pattern.

4. The light emitting device of claim 3, wherein the second thickness is in a range of about 500 nm to about 1000 nm.

5. The light emitting device of claim 3, wherein the first thickness satisfies at least λ/n in which the λ and the n represent a main wavelength of a light emitted from the active layer and a refractive index of the first conductive semiconductor layer of the light emitting structure, respectively.

6. The light emitting device of claim 2, wherein the current density adjusting pattern comprises a non-conductive material or a metallic material making non-ohmic contact with respect to the second conductive semiconductor layer.

7. The light emitting device of claim 1, wherein the column pattern or the hole pattern forms an in-phase relationship with respect to the current density adjusting pattern.

8. The light emitting device of claim 1, wherein the column pattern or the hole pattern forms an out-of-phase relationship with respect to the current density adjusting pattern.

9. The light emitting device of claim 1, wherein the current density adjusting pattern has a width different from a width of the column pattern or the hole pattern.

10. The light emitting device of claim 1, further comprising a reflective layer provided at a lateral side of the column pattern or the hole pattern.

11. The light emitting device of claim 1, wherein the electrode layer comprises a conductive support member, a reflective layer on the conductive support member, and an ohmic layer on the reflective layer.

12. A light emitting device package comprising:
a body;
at least one lead electrode on the body; and
a light emitting device electrically connected to the lead electrode,
wherein the light emitting device comprises:
an electrode layer;
a current density adjusting pattern on the electrode layer; and
a light emitting structure on the electrode layer and the current density adjusting pattern, the light emitting structure having a thickness less than about 2 μm, wherein a column pattern or a hole pattern serving as a structure of a resonant cavity is formed at an upper portion of the light emitting structure, and wherein the column pattern or the hole pattern vertically overlaps with respective ones of the current density adjusting pattern.

13. The light emitting device package of claim 12, wherein the light emitting structure comprises a second conductive semiconductor layer, an active layer on the second conductive semiconductor layer, and a first conductive semiconductor layer on the active layer, and wherein the column pattern or the hole pattern is formed at an upper portion of the first conductive semiconductor layer.

14. The light emitting device package of claim 13, wherein the first conductive semiconductor layer has a first thickness to provide the column pattern or the hole pattern and a second thickness formed under the column pattern or the hole pattern.

15. The light emitting device package of claim 14, wherein the first thickness satisfies at least $\lambda/n$ in which the $\lambda$ and the n represent a main wavelength of a light emitted from the active layer and a refractive index of the first conductive semiconductor layer of the light emitting structure, respectively.

16. The light emitting device package of claim 14, wherein the second thickness is in a range of about 500 nm to about 1000 nm.

17. The emitting device package of claim 13, wherein the current density adjusting pattern comprises a non-conductive material or a metallic material making non-ohmic contact with respect to the second conductive semiconductor layer.

18. The light emitting device package of claim 12, wherein the column pattern or the hole pattern forms an in-phase relationship with respect to the current density adjusting pattern.

19. A lighting system comprising:
a board; and
a light emitting module comprising a light emitting device on the board,
wherein the light emitting device comprises:
an electrode layer;
a current density adjusting pattern on the electrode layer; and
a light emitting structure on the electrode layer and the current density adjusting pattern, the light emitting structure having a thickness less than about 2 μm,
wherein a column pattern or a hole pattern serving as a structure of a resonant cavity is formed at an upper portion of the light emitting structure, and
wherein the column pattern or the hole pattern vertically overlaps with respective ones of the current density adjusting pattern.

20. The lighting system of claim 19, further comprising at least one of a light guide member, a diffusion sheet, a light collection sheet, a brightness enhancement sheet, and a fluorescent sheet provided on a path of a light emitted from the light emitting module.

* * * * *